United States Patent
Liaw

(10) Patent No.: US 11,728,431 B2
(45) Date of Patent: Aug. 15, 2023

(54) INNER SPACERS FOR GATE-ALL-AROUND SEMICONDUCTOR DEVICES

(71) Applicant: Taiwan Semiconductor Manufacturing Co., Ltd., Hsinchu (TW)

(72) Inventor: Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 119 days.

(21) Appl. No.: 16/525,876

(22) Filed: Jul. 30, 2019

(65) Prior Publication Data

US 2021/0036144 A1 Feb. 4, 2021

(51) Int. Cl.
*H01L 29/78* (2006.01)
*H01L 27/092* (2006.01)
*H01L 21/8238* (2006.01)
*H01L 29/66* (2006.01)

(52) U.S. Cl.
CPC .... *H01L 29/785* (2013.01); *H01L 21/823807* (2013.01); *H01L 21/823821* (2013.01); *H01L 21/823864* (2013.01); *H01L 27/0924* (2013.01); *H01L 29/66795* (2013.01)

(58) Field of Classification Search
CPC ............. H01L 27/0886; H01L 27/0924; H01L 27/1211; H01L 21/823864; H01L 21/823807; H01L 21/823821; H01L 21/845; H01L 29/7855; H01L 29/7856; H01L 29/785; H01L 29/66795; H01L 21/823431
See application file for complete search history.

(56) References Cited

U.S. PATENT DOCUMENTS

| 9,881,993 | B2 | 1/2018 | Ching et al. | |
| 2016/0020210 | A1* | 1/2016 | Liaw | H01L 29/495 |
| | | | | 257/369 |
| 2017/0104060 | A1* | 4/2017 | Balakrishnan | ............... |
| | | | | H01L 21/823412 |
| 2018/0114727 | A1* | 4/2018 | Rodder | H01L 21/823828 |

OTHER PUBLICATIONS

Liaw, Jhon Jhy, "Memory Devices with Gate All Around Transistors", U.S. Appl. No. 16/225,681, filed Dec. 19, 2018, 35 pages.

* cited by examiner

*Primary Examiner* — Monica D Harrison
*Assistant Examiner* — John Lin
(74) *Attorney, Agent, or Firm* — Haynes and Boone, LLP

(57) ABSTRACT

Semiconductor devices and methods are provided. A semiconductor device according to the present disclosure includes a first gate-all-around (GAA) transistor that includes a first plurality of channel members, and a second GAA transistor that includes a second plurality of channel members. The first plurality of channel members has a first pitch (P1) and the second plurality of channel members has a second pitch (P2) smaller than the first pitch (P1).

20 Claims, 13 Drawing Sheets

INNER SPACERS FOR GATE-ALL-AROUND SEMICONDUCTOR DEVICES

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and gate-all-around (GAA) transistors (both also referred to as non-planar transistors) are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). Compared to planar transistors, such configuration provides better control of the channel and drastically reduces SCEs (in particular, by reducing sub-threshold leakage (i.e., coupling between a source and a drain of the FinFET in the "off" state)). A GAA transistor has a gate structure that can extend, partially or fully, around a channel region to provide access to the channel region on two or more sides. The channel region of the GAA transistor may be formed from nanowires, nanosheets, other nanostructures, and/or other suitable structures. In some implementations, such channel region includes multiple nanowires (which extend horizontally, thereby providing horizontally-oriented channels) vertically stacked. Such GAA transistor can be referred to as a vertically-stacked horizontal GAA (VGAA) transistor.

IC devices include transistors that serve different functions, such as input/output (I/O) functions and core functions. These different functions require the transistors to have different constructions. At the same time, it is advantageous to have similar process windows to fabricate these different transistors. Although existing GAA transistors and processes are generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
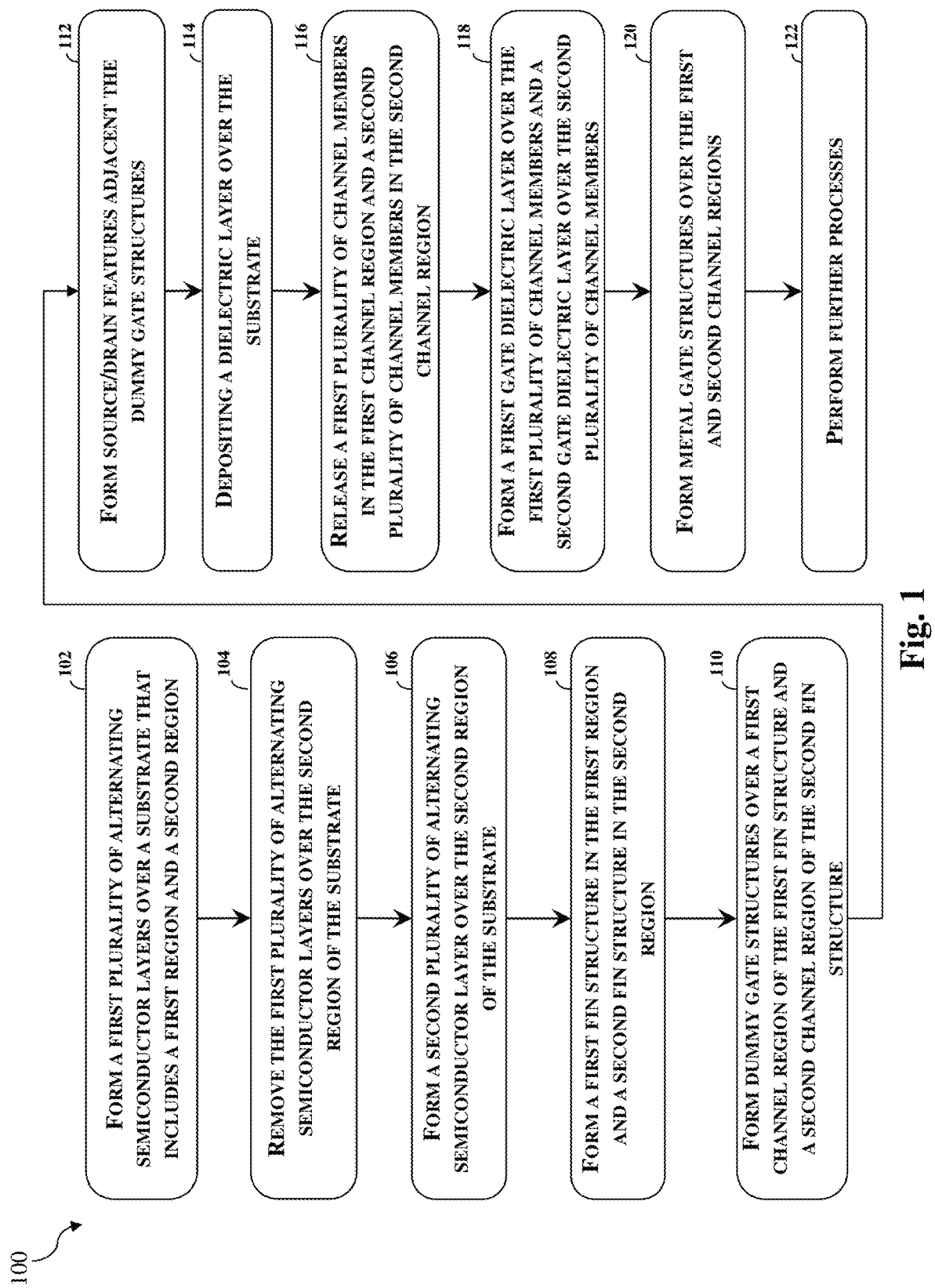
FIG. 1 is a flowchart illustrating a method of forming a semiconductor device according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Still further, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm.

The present disclosure relates to GAA transistors, and more particularly, to I/O and core GAA transistors in a semiconductor device. A semiconductor device according to embodiments of the present disclosure includes a first-type GAA transistor to serve I/O functions and a second-type GAA transistor to serve core functions. To ensure process windows and performance, the channel members in the first-type GAA transistor have a first pitch (or first vertical pitch) that is greater than a second pitch (or second vertical pitch) of the channel members in the second-type GAA transistor. The first-type GAA transistor and the second-type GAA transistor are fabricated off of different epitaxial semiconductor stacks to achieve such different pitches. In addition, the first-type GAA transistor includes a first gate dielectric layer that is thicker than a second gate dielectric layer of the second-type GAA transistor.

FIG. 1 illustrates a flow chart of a method 100 for fabricating a semiconductor device according to various aspects of the present disclosure. FIG. 1 will be described below in conjunction with FIGS. 2, 3, 4A, 4B, 5A, 5B, 6A, 6B, 7A, 7B, 8A, and 8B, which are fragmentary cross-sectional views of a workpiece at various stages of fabrication according to method 100 in FIG. 1 before the semiconductor device is fabricated on the workpiece. Throughout the present disclosure, for the ease of reference, the workpiece and the semiconductor device may be referred to interchangeably as the workpiece is to become the semiconductor device at the conclusion of the processes and may share the same reference numeral. Additional steps can be provided before, during, and after method 100, and some of the steps described can be moved, replaced, or eliminated for additional embodiments of method 100. Additional features can be added in the semiconductor device depicted in FIGS. 2, 3, 4A, 4B, 5A, 5B, 6A, 6B, 7A, 7B, 8A, and 8B and some of the features described below can be replaced, modified, or eliminated in other embodiments of the semiconductor device.

Figure 2:
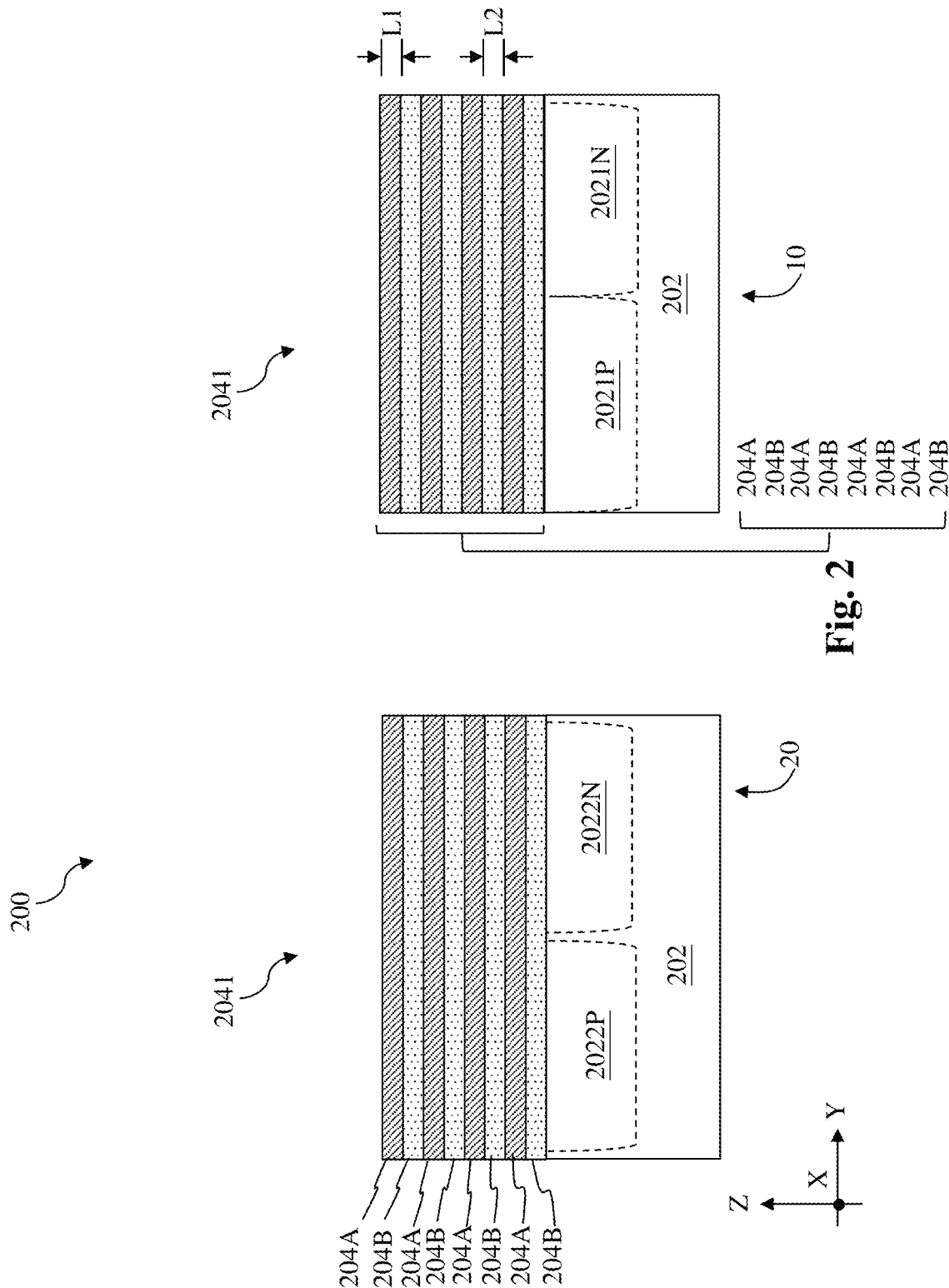
FIGS. 2, 3, 4A, 4B, 5A, 5B, 6A, 6B, 7A, 7B, 8A, and 8B illustrate fragmentary cross-sectional views of a workpiece at various stages of fabrication, according to various aspects of the present disclosure.

Referring now to FIGS. 1 and 2, the method 100 includes a block 102 where a first plurality of alternating semiconductor layers 2041 over a first region 10 and a second region 20 of a substrate 202 in a workpiece 200. In some embodiments, the substrate 202 includes silicon. Alternatively or additionally, substrate 202 includes another elementary semiconductor, such as germanium; a compound semiconductor, such as silicon carbide, gallium arsenide, gallium phosphide, indium phosphide, indium arsenide, and/or indium antimonide; an alloy semiconductor, such as silicon germanium (SiGe), GaAsP, AlInAs, AlGaAs, GaInAs, GaInP, and/or GaInAsP; or combinations thereof. In some implementations, substrate 202 includes one or more group III-V materials, one or more group II-IV materials, or combinations thereof. In some implementations, substrate 202 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 202 can include various doped regions configured according to design requirements of semiconductor device 200, such as p-type doped regions (or p-wells) 2021P and 2022P, and n-type doped regions (or n-wells) 2021N and 2022N, or combinations thereof. P-type doped regions, such as 2021P and 2022P, include p-type dopants, such as boron, indium, other p-type dopant, or combinations thereof. N-type doped regions, such as 2021N and 2022N, include n-type dopants, such as phosphorus, arsenic, other n-type dopant, or combinations thereof. In some implementations, substrate 202 includes doped regions formed with a combination of p-type dopants and n-type dopants. The various doped regions can be formed directly on and/or in substrate 202, for example, providing a p-well structure, an n-well structure, a dual-well structure, a raised structure, or combinations thereof. An ion implantation process, a diffusion process, and/or other suitable doping process can be performed to form the various doped regions. In some embodiments, p-type GAA devices are formed over n-type wells and n-type GAA devices are formed over p-type wells.

The first region 10 and the second region 20 are device regions that include transistors serving different functions. In some embodiments, the first region 10 is a core device region (or core region) and the second region 20 is an input/output (I/O) device region (or I/O region). In those embodiments, a core device region refers to a device region that includes logic cells, such as inverter, NAND, NOR, AND, OR, and Flip-Flop, as well as memory cells, such as static random access memory (SRAM), dynamic random access memory (DRAM), and Flash. An I/O device region refers to a device region that interfaces between a core device region and external/peripheral circuitry, such as the circuit on the printed circuit board (PCB) on which the semiconductor device 200 is mounted. Operating voltage for the I/O device region is similar to external voltage (voltage level of the external/peripheral circuitry) and is higher than the operating voltage of the core device region. To accommodate the higher operating voltage, transistors in the I/O device region may have thicker gate dielectric layers and longer channels as compared to their counterparts in the core device region. In conventional processes, transistors in the I/O device region and the core device region are formed from the same alternating semiconductor layers. The thicker gate dielectric layers of transistors in the I/O device region may considerably reduce the process window and yield as the thicker gate dielectric layers may reduce the space for deposition of the work function metal layers and metal gate fill layers. As will be described below, embodiments of the present disclosure provide advantages because they decouple formation of GAA transistor devices in different device regions by forming different alternating semiconductor layers for different device regions to accommodate different device attributes (such as different gate dielectric layer thicknesses or different operating voltages). While different alternating semiconductor layers are formed in different device regions, formation of GAA transistor devices in different regions may share common processes to reduce cost and have similar process windows to improve yield.

In the embodiments represented in FIG. 2, the first plurality of alternating semiconductor layers 2041 includes a plurality of first semiconductor layers 204A interleaved by a plurality of the second semiconductor layers 204B. That is, two neighboring first semiconductor layers 204A sandwich one second semiconductor layer 204B. The plurality of first semiconductor layers 204A is formed of a first semiconductor material and the plurality of second semiconductor layers 204B is formed of a second semiconductor material that is different from the first semiconductor material. In some embodiments, the first semiconductor material is or consists essentially of silicon (Si) and the second semiconductor material is or consists essentially of germanium (Ge). The first plurality of alternating semiconductor layers 2041 may be formed by depositing or epitaxially growing the plurality of first semiconductor layers 204A and the plurality of second semiconductor layers 204B alternatingly. In some implementations illustrated in FIG. 2, each of the plurality of first semiconductor layers 204A includes a first thickness L1 and each of the plurality of second semiconductor layers 204B includes a second thickness L2. In some instances, a ratio of the first thickness L1 to the second thickness L2 (L1/L2) is between about 0.5 and about 2.0. In some implementations, after the first plurality of alternating semiconductor layers 2041 is patterned into fin structures (fin-shaped active regions), a portion of the plurality of the second semiconductor layers 204B in channel regions may be selectively removed to release channel members formed from the plurality of the first semiconductor layers 204A. In this regard, the second semiconductor layers 204B function as sacrificial semiconductor layers and may be referred to as so.

Figure 3:
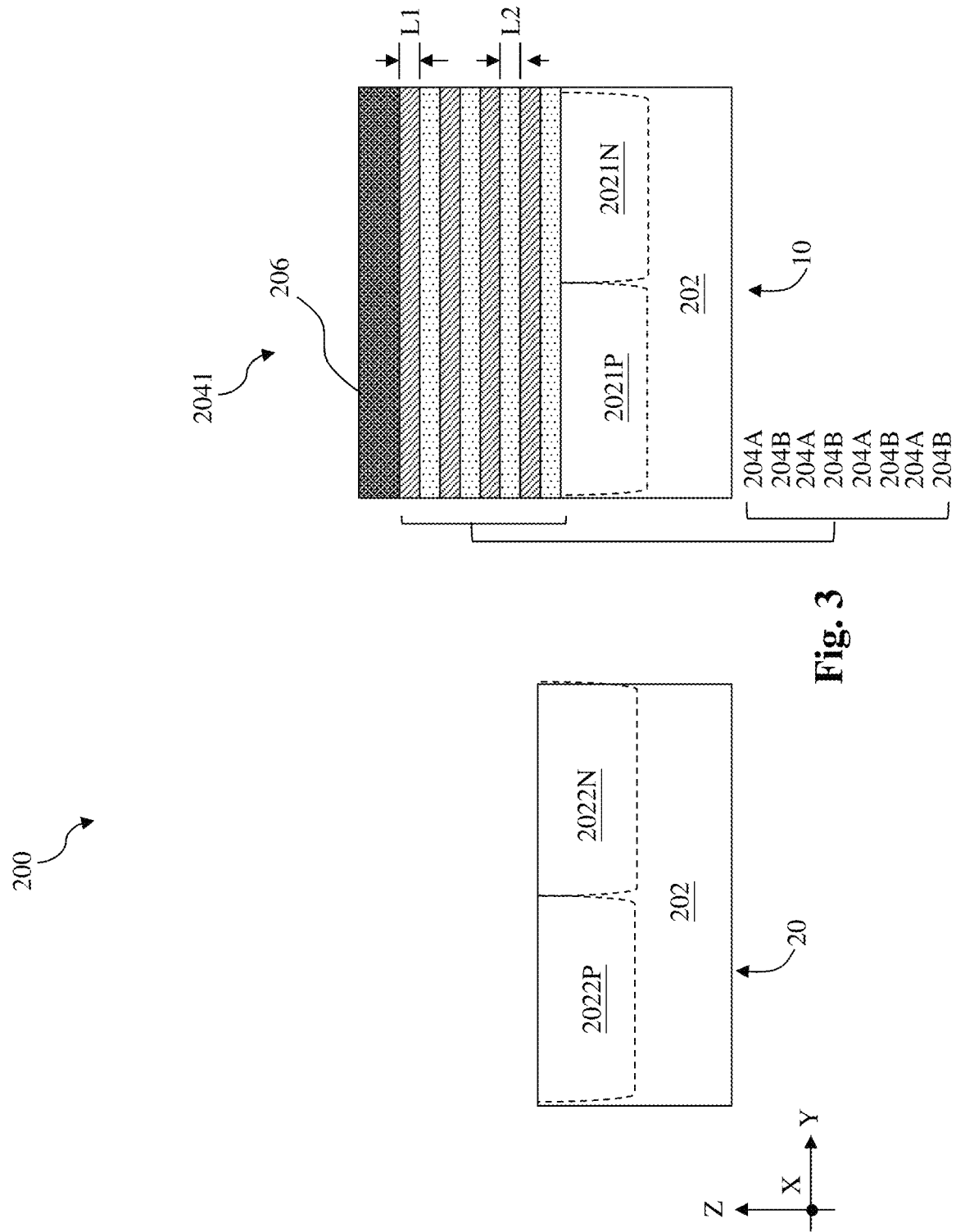

Referring now to FIGS. 1 and 3, the method 100 includes a block 104 where the first plurality of alternating semiconductor layers 2041 over the second region 20 of the substrate 202 is removed. In some embodiments, photolithography techniques may be used to remove the first plurality of alternating semiconductor layers 2041 from the second region 20. For example, one or more hard mask layers may be formed over the first plurality of alternating semiconductor layers 2041. In some embodiments, the one or more hard mask layers may be formed of semiconductor oxide, such as silicon oxide, or semiconductor nitride, such as silicon nitride and may be deposited using chemical vapor deposition (CVD), flowable CVD (FCVD), spin-on coating, or other suitable technique. Thereafter, a photoresist layer is deposited over the one or more hard mask layers using CVD, FCVD, spin-on coating, or other suitable technique. The photoresist layer is then exposed to radiation reflected from or going through a patterned mask. After being subject to a post-exposure bake, the exposed photoresist layer may undergo chemical changes that allow the exposed or the unexposed portions of the photoresist layer to be removed by a developer to form a patterned photoresist layer. At block 104, the patterned photoresist layer may expose one or more hard mask layers in the second region 20 while covering the one or more hard mask layers in the first region 10. The patterned photoresist layer may then be used as an etch mask to pattern the one or more hard mask layers to form a patterned hard mask. The patterned hard mask covers the first plurality of alternating semiconductor layers 2041 in the first region 10 while exposing the first plurality of alternating semiconductor layer 2041 in the second region 20. The exposed first plurality of alternating semiconductor layers 2041 in the second region 20 is then removed by a suitable etch process, such as a dry etch process or a wet etch process.

Figure 4A:
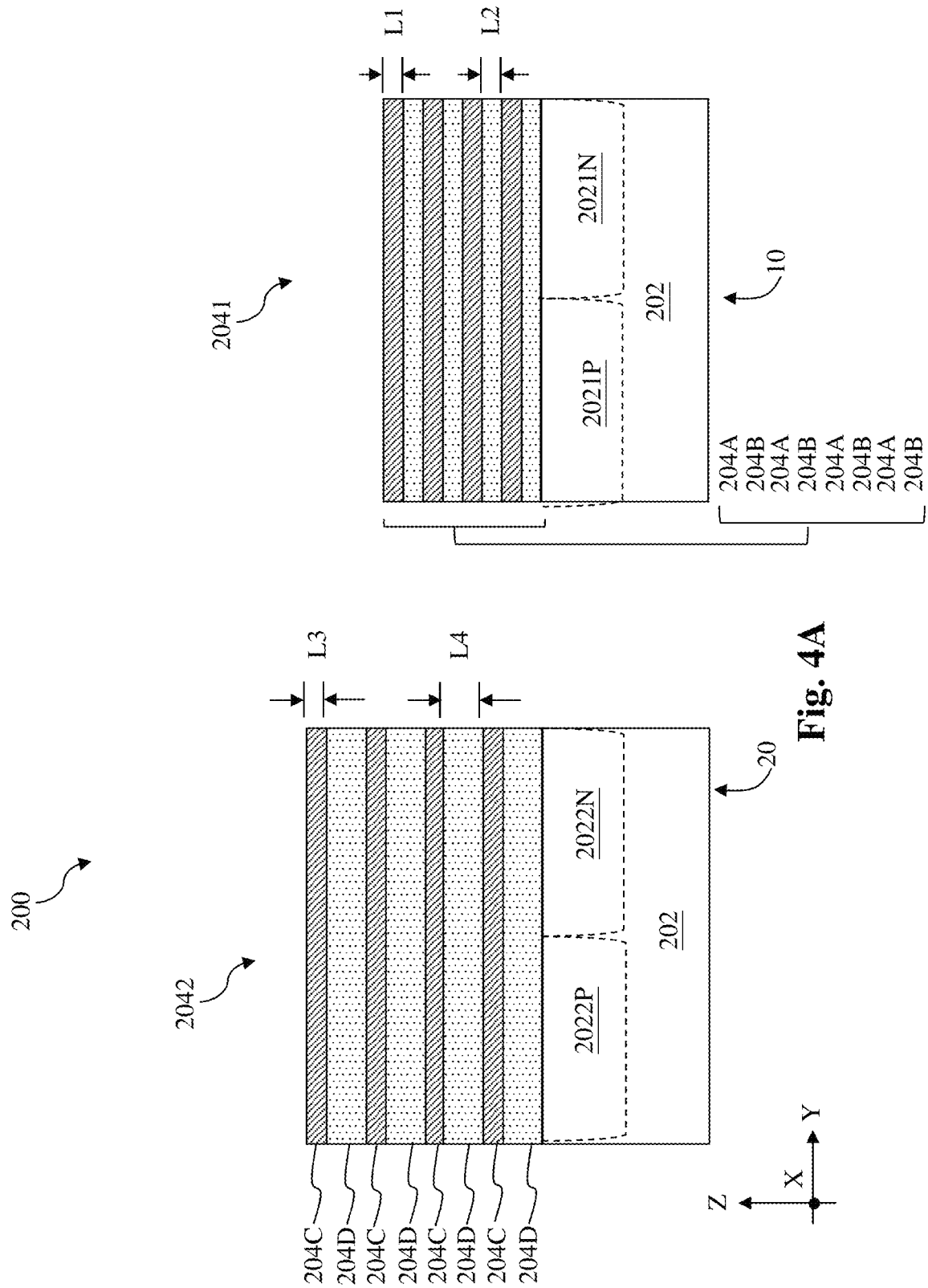
Figure 4B:
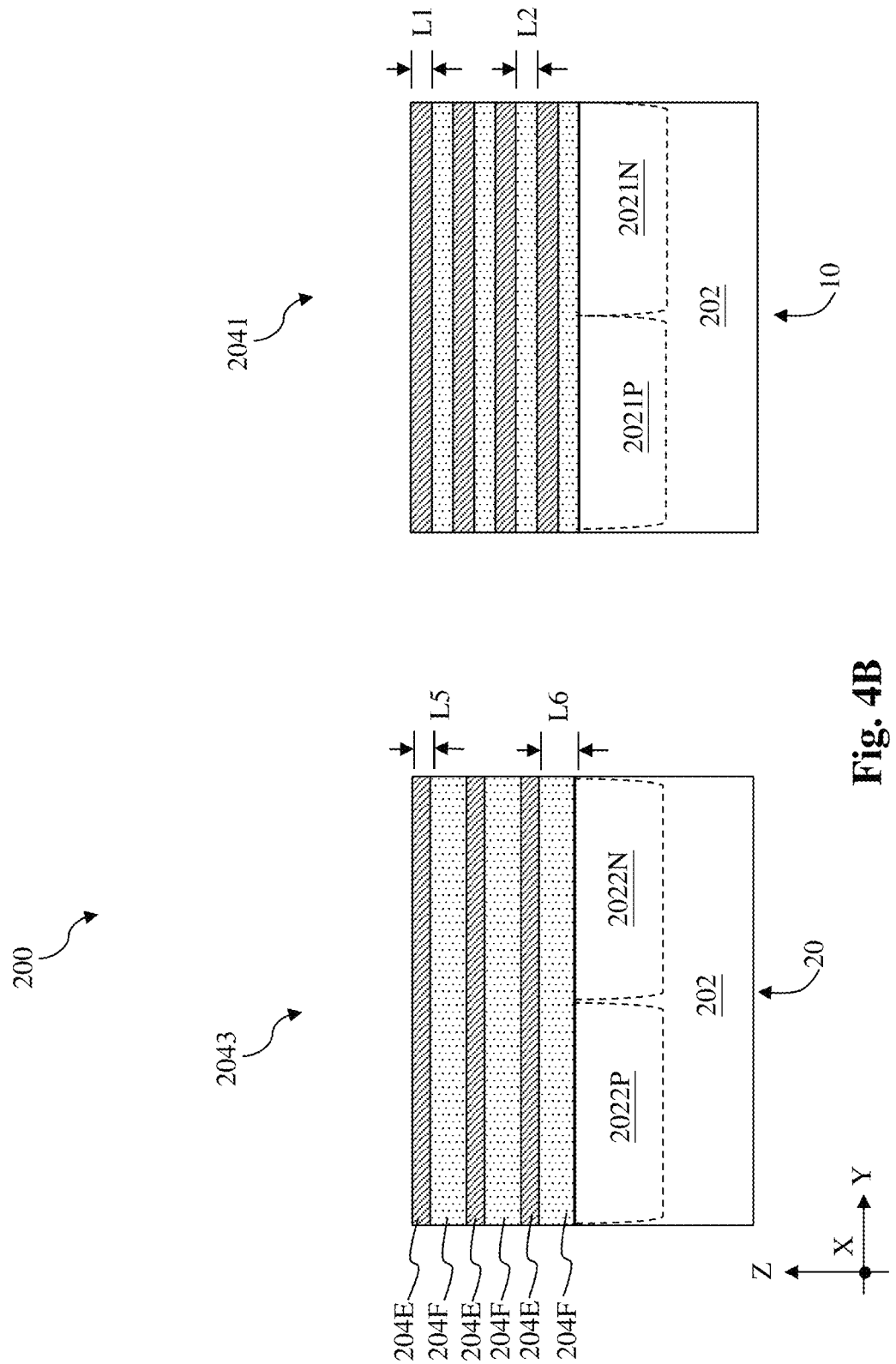

Referring to FIGS. 1, 4A and 4B, the method 100 includes a block 106 where a second plurality of alternating semiconductor layers 2042 is formed over the second region 20. In the embodiments represented in FIG. 4A, the second plurality of alternating semiconductor layers 2042 includes a plurality of third semiconductor layers 204C interleaved by a plurality of the fourth semiconductor layers 204D. That is, two neighboring third semiconductor layers 204C sandwich one fourth semiconductor layer 204D. Similar to the pluralities of first and second semiconductor layers 204A and 204B described above, the plurality of third semiconductor layers 204C is formed of the first semiconductor material and the plurality of fourth semiconductor layers 204D is formed of the second semiconductor material that is different from the first semiconductor material. In some embodiments, the first semiconductor material is or consists essentially of silicon (Si) and the second semiconductor material is or consists essentially of germanium (Ge). The second plurality of alternating semiconductor layers 2042 may be formed by depositing or epitaxially growing the plurality of third semiconductor layers 204C and the plurality of fourth semiconductor layers 204D alternatingly. In some implementations illustrated in FIG. 4A, each of the plurality of third semiconductor layers 204C includes a third thickness L3 and each of the plurality of fourth semiconductor layers 204D includes a fourth thickness L4. In some instances, a ratio of the third thickness L3 to the fourth thickness L4 (L3/L4) is between about 0.4 and about 1.2. In some implementations, after the second plurality of alternating semiconductor layers 2042 is patterned into fin structures (fin-shaped active regions), a portion of the plurality of the fourth semiconductor layers 204D in channel regions may be selectively removed to release channel members formed from the plurality of the third semiconductor layers 204C. In this regard, the fourth semiconductor layers 204D function as sacrificial semiconductor layers and may be referred to as so. In some embodiments, the third thickness L3 may be equal to or greater than the first thickness L1 and the fourth thickness L4 may be about 1.1 times to about 1.5 times of L2. In some instances, the first semiconductor layers 204A in the first plurality of alternating semiconductor layers 2041 have a layer pitch that is smaller than a layer pitch of the third semiconductor layers 204C in the second plurality of alternating semiconductor layers 2042. In some implementations, the second region 20 is an I/O device region and transistors in the second region 20 may require thicker gate dielectric layer. In those implementations, the greater fourth thickness L4 of the fourth semiconductor layers 204D (i.e. the sacrificial semiconductor layers) may provide more space for formation of work function layers and metal gate fill layers, thereby increasing the process windows.

Alternatively, in the embodiments represented in FIG. 4B, a third plurality of alternating semiconductor layers 2043 is deposited over the second region 20 and includes a plurality of fifth semiconductor layers 204E interleaved by a plurality of the sixth semiconductor layers 204F. That is, two neighboring fifth semiconductor layers 204E sandwich one sixth semiconductor layer 204F. Similar to the pluralities of first and second semiconductor layers 204A and 204B described above, the plurality of fifth semiconductor layers 204E is formed of the first semiconductor material and the plurality of sixth semiconductor layers 204F is formed of the second semiconductor material that is different from the first semiconductor material. In some embodiments, the first semiconductor material is or consists essentially of silicon (Si) and the second semiconductor material is or consists essentially of germanium (Ge). The third plurality of alternating semiconductor layers 2043 may be formed by depositing or epitaxially growing the plurality of fifth semiconductor layers 204E and the plurality of sixth semiconductor layers 204F alternatingly. In some implementations illustrated in FIG. 4B, each of the plurality of fifth semiconductor layers 204E includes a fifth thickness L5 and each of the plurality of sixth semiconductor layers 204F includes a sixth thickness L6. In some instances, a ratio of the fifth thickness L5 to the sixth thickness L6 (L5/L6) is between about 0.4 and about 1.2. In some implementations, after the third plurality of alternating semiconductor layers 2043 is patterned into fin structures (fin-shaped active regions), a portion of the plurality of the sixth semiconductor layers 204F in channel regions may be selectively removed to release channel members formed from the plurality of the fifth semiconductor layers 204E. In this regard, the sixth semiconductor layers 204F function as sacrificial semiconductor layers and may be referred to as so. In some embodiments, the fifth thickness L5 may be equal to or greater than the first thickness L1 and the sixth thickness L6 may be about 1.1 times to about 1.5 times of L2. In some instances, the first semiconductor layers 204A in the first plurality of alternating semiconductor layers 2041 have a layer pitch that is smaller than a layer pitch of the fifth semiconductor layers 204E in the third plurality of alternating semiconductor layers 2043. In some implementations, the second region 20 is an I/O device region and transistors in the second region 20 may require thicker gate dielectric layer. In those implementations, the greater sixth thickness L6 of the sixth semiconductor layers 204F (i.e. the sacrificial semiconductor layers) may provide more space for formation of work function layers and metal gate fill layers, thereby increasing the process windows.

The first plurality of alternating semiconductor layers 2041 may include a first number (N1) of first semiconductor layers 204A and the second plurality of alternating semiconductor layers 2042 may include a second number (N2) of third semiconductor layers 204C. In some embodiments represented in FIG. 4A, N1 is equal to N2. That is, a GAA transistor to be formed in the first region 10 and a GAA transistor to be formed in the second region 20 have the same number of channel members. In some instances, N1 is between 3 and 10. For example, N1 may be 4 or 5. In FIG. 4A, the first plurality of alternating semiconductor layers 2041 includes 4 first semiconductor layers 204A and the second plurality of alternating semiconductor layers 2042 includes 4 third semiconductor layers 204C. In some alternative embodiments, the GAA transistors to be formed in the second region 20 may have different number of channel members. An example is illustrated in FIG. 4B. There, instead of the second plurality of alternating semiconductor layers 2042, a third plurality of alternating semiconductor layers 2043 is formed over the first region 10. The third plurality of alternating semiconductor layers 2043 may include a plurality of fifth semiconductor layers 204E and a plurality of sixth semiconductor layers 204F. In the embodiments represented in FIG. 4B, the third plurality of alternating semiconductor layers 2043 includes a third number (N3) of fifth semiconductor layers 204E and N3 is smaller than N1. In some implementations, N3 is equal to (N1−1) or (N1−2). For example, in embodiments where N1 is 4, N3 may be 3 or 2. The first number N1, the second number N2, and the third number N3 correspond to the number of channel members in respectively GAA transistors. For example, GAA transistors formed from the first plurality of alternating semiconductor layers 2041 each include N1 channel members; GAA transistors formed from the second plurality of alternating semiconductor layers 2042 each include N2 channel members; and GAA transistors formed from the third plurality of alternating semiconductor layers 2043 each include N3 channel members. FIG. 4B represents embodiments where GAA transistors to be formed in the first region 10 have less channel members than those to be formed in the second region 20.

Figure 5A:
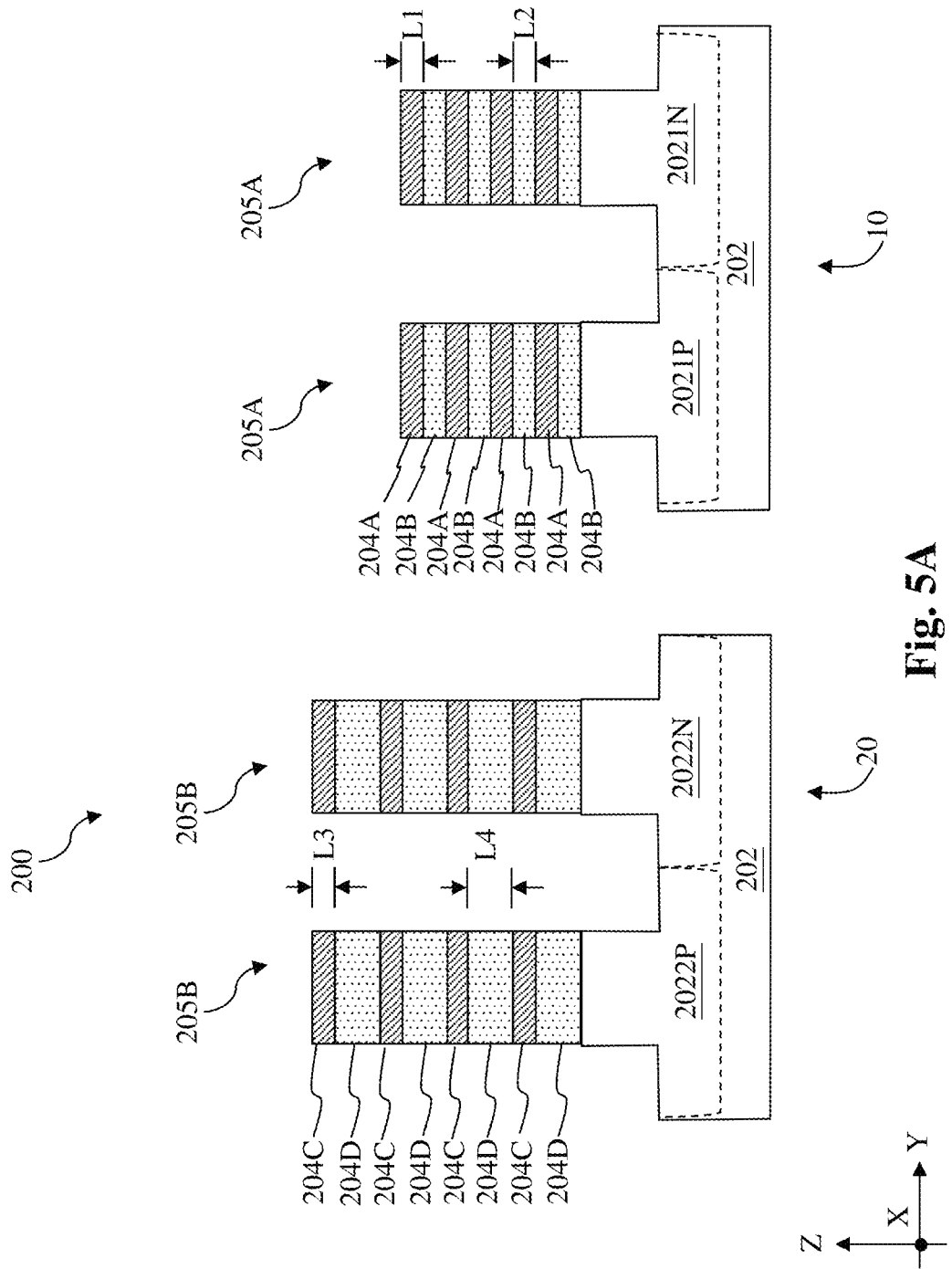
Figure 5B:
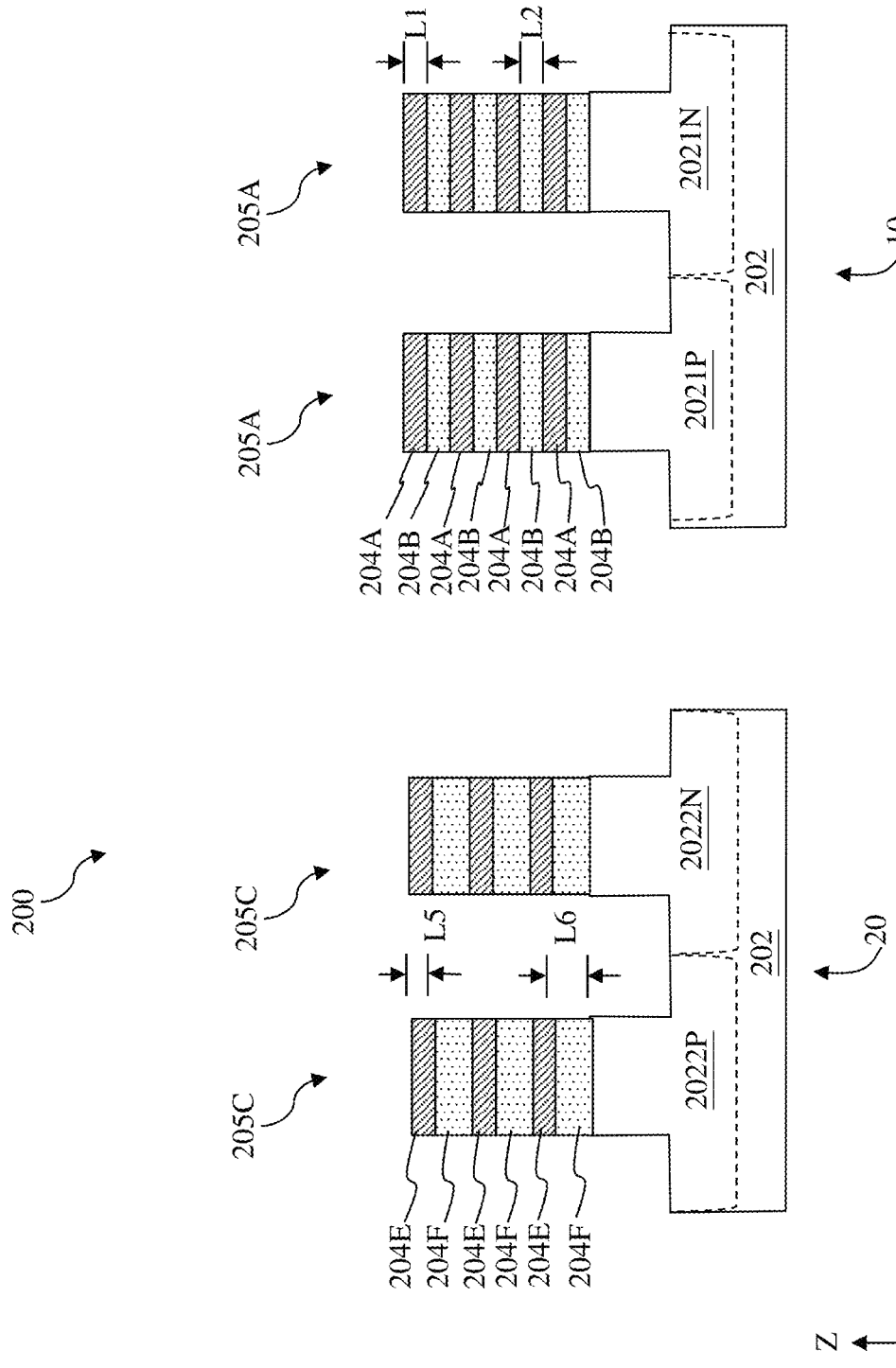

Referring to FIGS. 1, 5A and 5B, the method 100 includes a block 108 where a first fin structure 205A and a second fin structure 205B are formed in the first region 10 and the second region 20, respectively. In some embodiments represented in FIG. 5A, the first plurality of alternating semiconductor layers 2041 over the first region 10 may be patterned to form the first fin structures (or first fin-shaped active regions) 205A and the second plurality of alternating semiconductor layers 2042 over the second region 20 may be patterned to form the second fin structures (or second fin-shaped active regions) 205B. Alternatively, in some embodiments represented in FIG. 5B, the third plurality of alternating semiconductor layers 2043 over the second region 20 may be patterned to form the third fin structures (or third fin-shaped active regions) 205C. At block 108, the first fin structures 205A, the second fin structures 205B, or the third fin structures 205C may be patterned by using suitable processes such as photolithography and etching processes. In some embodiments, the fin structures are etched from the respective alternating semiconductor layers using dry etch or plasma processes. In some other embodiments, the fin structures can be formed by a double-patterning lithography (DPL) process, a quadruple-patterning lithography (QPL) process or a multiple-patterning lithography (MPL) process. Generally, DPL, QPL and MPL processes combine photolithography and self-aligned processes, allowing patterns to be created that have, for example, pitches smaller than what is otherwise obtainable using a single, direct photolithography process. As shown in FIG. 5A, the first fin structures 205A may extend from respectively doped regions, including the p-type doped region 2021P and n-type doped region 2021N and the second fin structures 205B may extend from respective doped regions, including the p-type doped region 2022P and n-type doped region 2022N. Similarly, as shown in FIG. 5B, when the third fin structures 205C, rather than the second fin structures 205B, are formed in the second region 20, the third fin structures 205C may extend from respectively doped regions, including the p-type doped region 2022P and the n-type doped region 2022N. As illustrated in FIGS. 5A and 5B, in some embodiments, the substrate 202 is also etched at block 108.

Figure 6A:
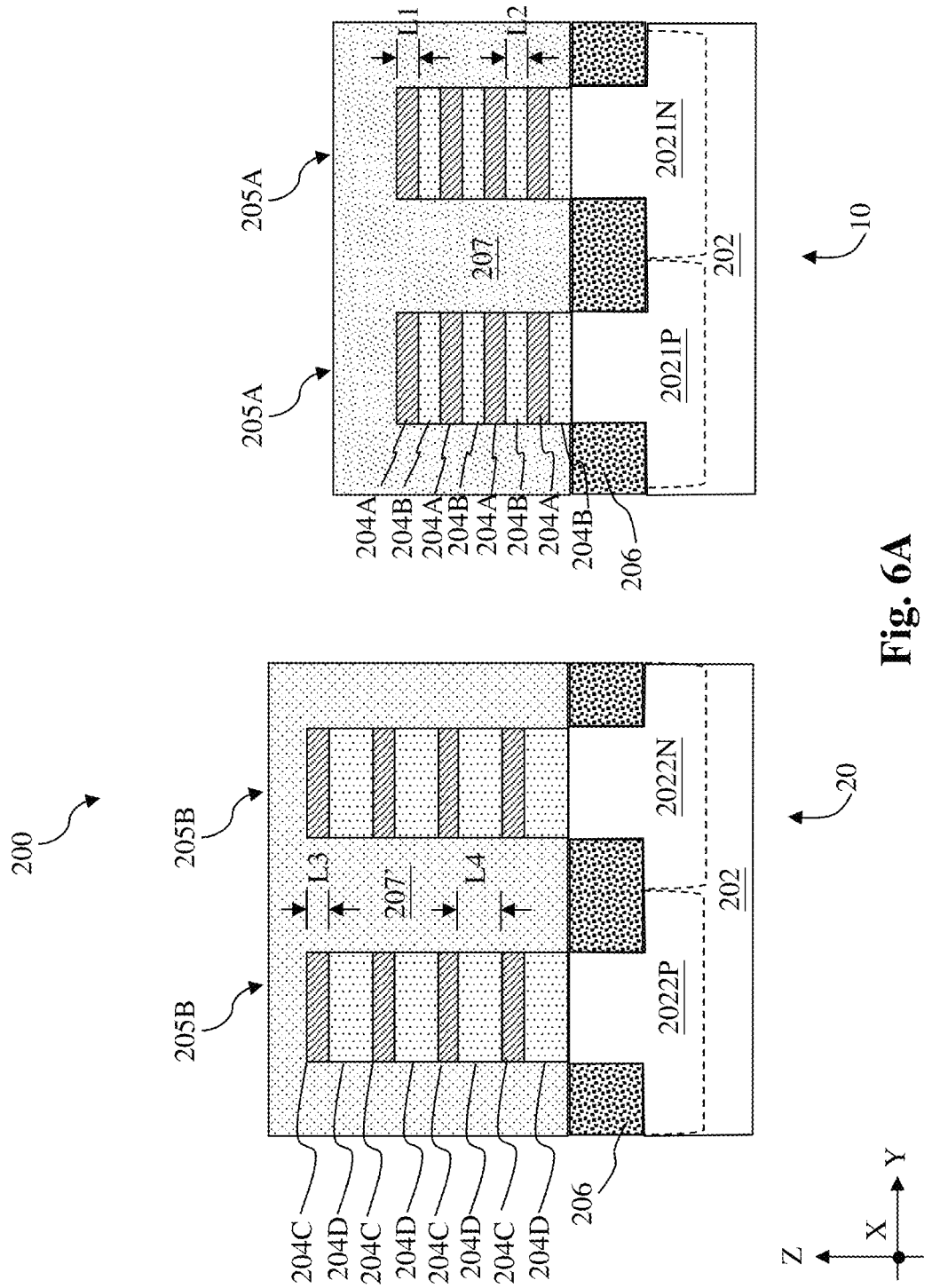
Figure 6B:
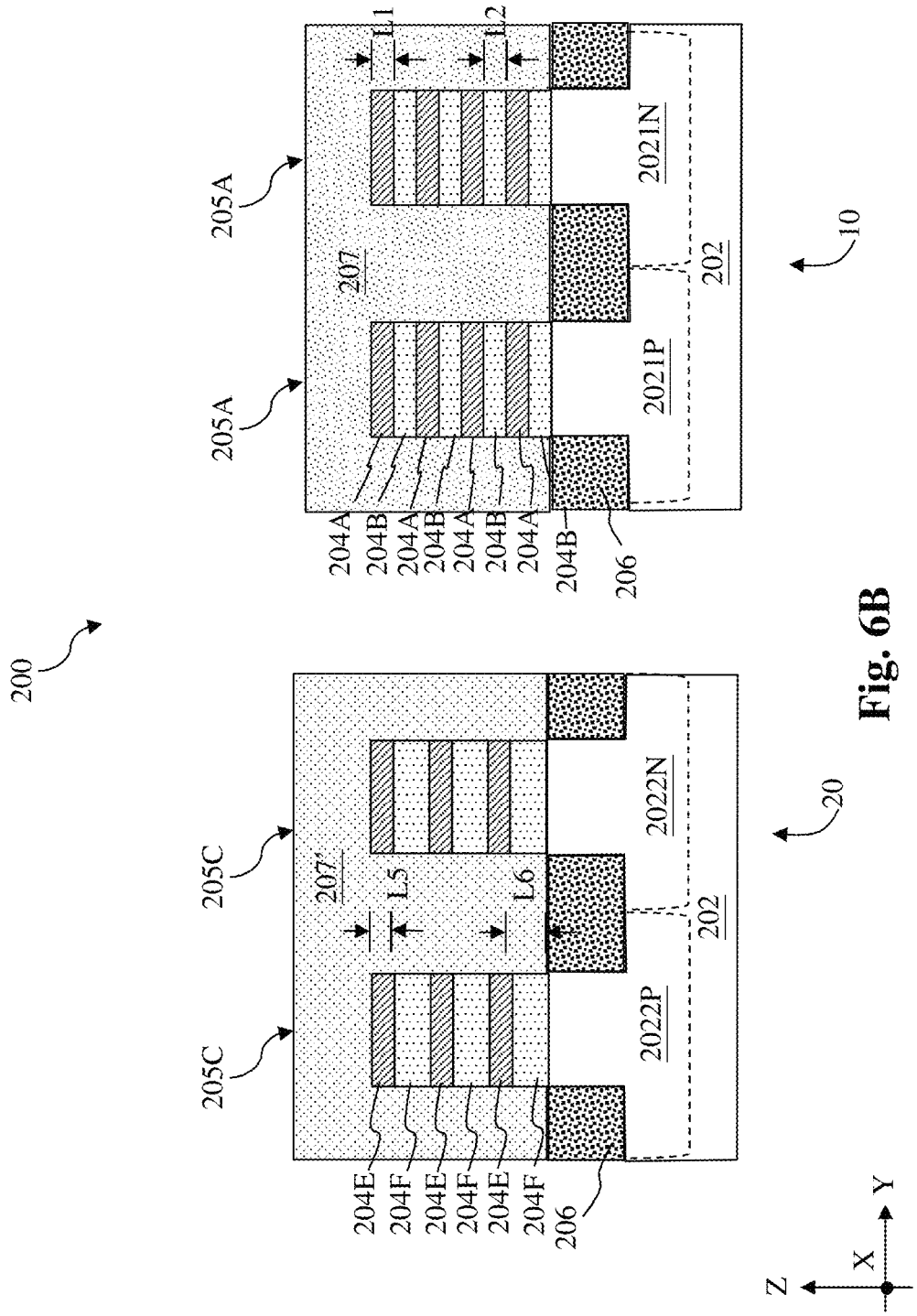

Referring FIGS. 1, 6A and 6B, the method 100 includes a block 110 where first dummy gate structures 207 and second dummy gate structures 207' are formed over a first channel region of the first fin structures 205A structure and a second channel region of the second fin structures 205B (or a third channel region of the third fin structures 205C), respectively. In some implementations, dielectric isolation features 206 are formed between the fin structures before the first dummy gate structures 207 and the second dummy gate structures 207' are form. The dielectric isolation features 206 may also be referred to as shallow trench isolation (STI) features 206. In embodiments where the second region 20 is an I/O region, the second dummy gate structures 207' in the second region 20 may be long dummy gate structures that have a gate length that is between about 1.5 times and about 4 times of the gate length of the first dummy gate structures 207 in the first region 10. For the ease of reference, the first dummy gate structures 207 and the second dummy gate structures 207' may be collectively referred to as dummy gate structures 207. In some embodiments, a gate-last process flow is adopted and the dummy gate structures 207 are first formed as placeholders for the metal gate structures 208 (shown in FIGS. 7A and 7B) to be formed at a later point. Because the metal gate structures 208 are formed later the process to replace the dummy gate structures 207, damages to the metal gate structures 208 from various processes may be averted. In some implementations, a dummy gate dielectric layer (not shown) may also be formed between the first dummy gate structures 207 and the first fin structures 205A or between the second dummy gate structures 207' and the second fin structures 205B. The dummy gate structures 207 may be formed of polysilicon. As described above with respect to FIGS. 4A and 4B, FIG. 6A represents embodiments where GAA transistors to be formed in the first region 10 and the second region 20 have identical number of channel members; and FIG. 6B represents embodiments where GAA transistors to be formed in the second region 20 have less channel members than those to be formed in the first region 10.

In some embodiments, one or more gate spacers (or gate spacer layers) 220 (shown in FIGS. 8A and 8B) are formed over the dummy gate structure 207. The one or more gate spacers 220 are disposed over and along side surfaces (or sidewalls) of the dummy gate structure 207. The one or more spacers 220 may provide isolation between the metal gate structure 208 and neighboring source/drain contacts and may also protect structures adjacent to the dummy gate structure 207 when the dummy gate structure 207 is removed at a later time. In some embodiments, one or more dielectric dummy gate structures 218 (shown in FIGS. 8A and 8B) may be formed along with the dummy gate structures 207. The dielectric dummy gate structures 218 function to separate cells of semiconductor devices. In some embodiments, each of the one or more gate spacers may include one or more dielectric materials selected from a group consisting of silicon oxide, silicon oxynitride, silicon nitride, silicon oxycarbonitride, a low-k dielectric material with a dielectric constant lower than 4, or a combination thereof.

Figure 7A:
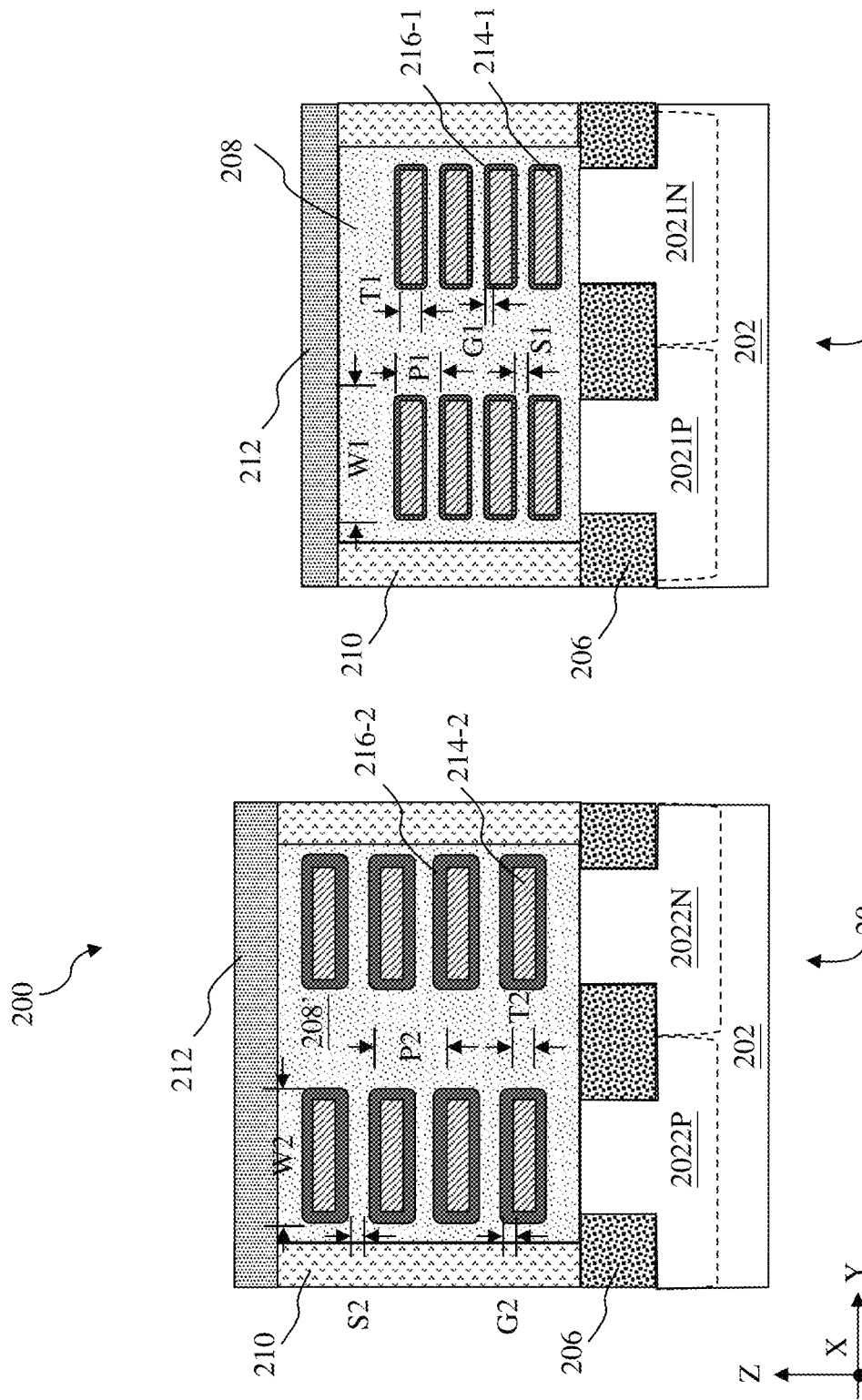
Figure 7B:
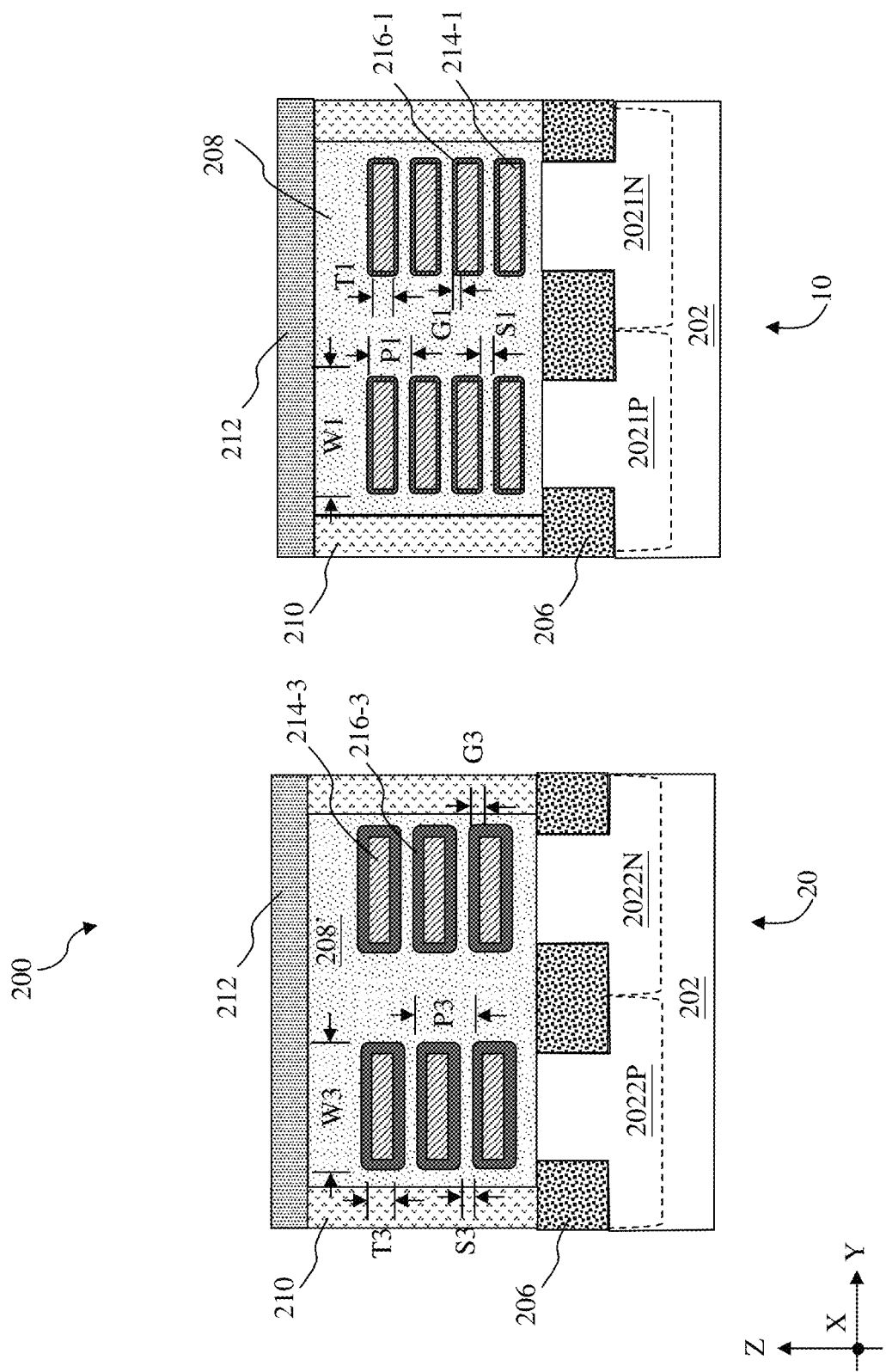

In some embodiments, the dummy gate structure 207 in FIGS. 6A and 6B may undergo a dummy gate cut process, resulting in gate end dielectric features, such as the gate end dielectric features 210 shown in FIGS. 7A and 7B.

Figure 8A:
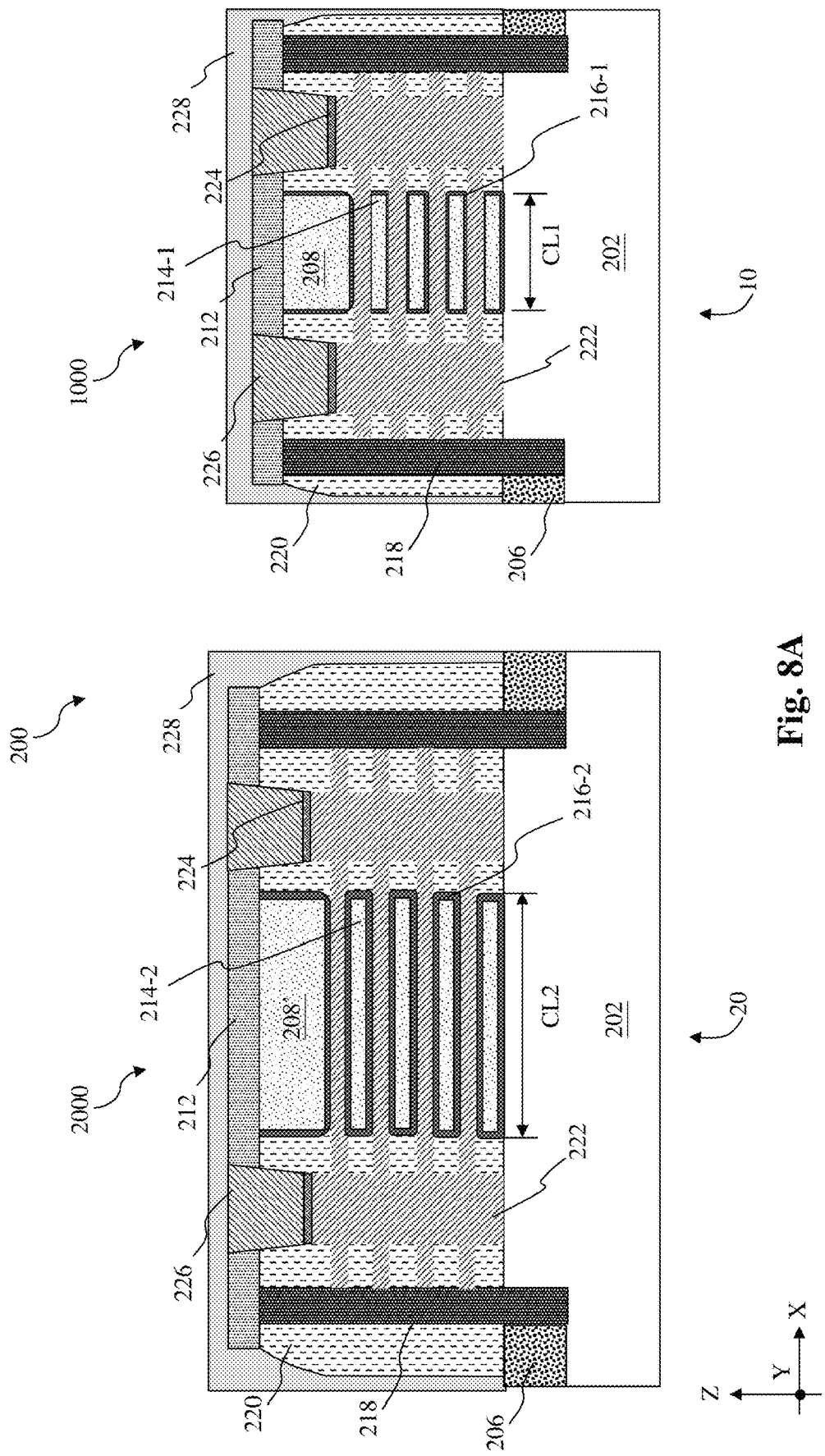
Figure 8B:
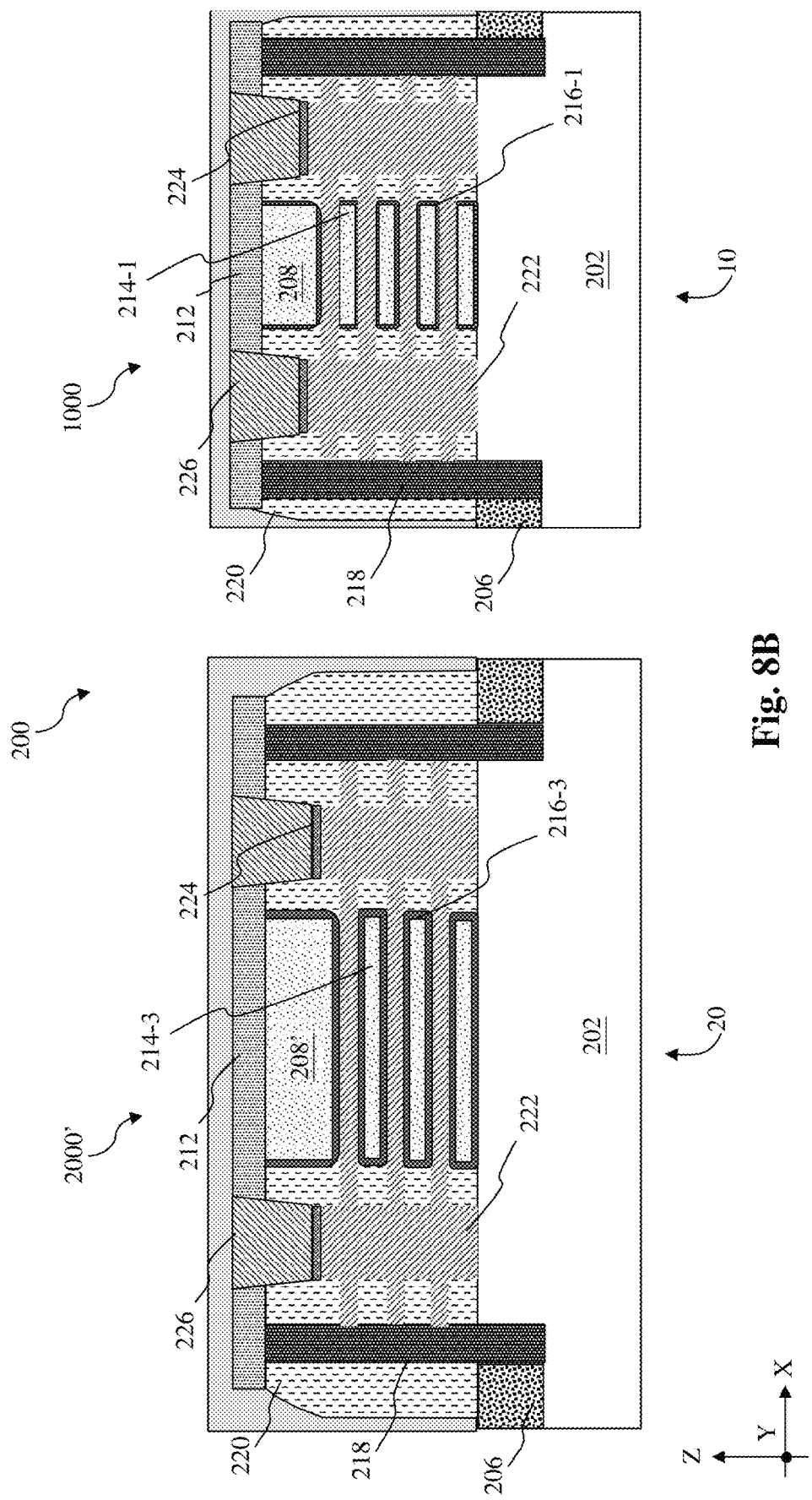

Referring to FIG. 1, the method 100 includes a block 112 where source/drain features 222 are formed adjacent the dummy gate structures 207. While FIGS. 8A and 8B are mainly for illustration of further processes that may be performed to the workpiece 200 at block 122, they illustrate relative positions and structures of source/drain features 222 formed at block 112 of the method 100. In some embodiments, source/drain regions of the first fin structures 205A in FIGS. 6A and 6B, second fin structures 205B in FIG. 6B, and third fin structures 205C in FIG. 6B are recessed to expose the sidewalls of the channel regions of the first fin structures 205A, the second fin structures 205b, and the third fin structures 205C. In some implementations, the plurality of the second semiconductor layers 204B of the first fin structure 205A, the plurality of fourth semiconductor layers 204D of the second fin structure 205B, and the plurality of sixth semiconductor layers 204F of the third fin structure 205C may be partially and selectively etched to form recesses. A spacer dielectric material may then be deposited over the workpiece 200, including within the recesses. The deposited spacer dielectric material is then pulled back to form inner spacers in the recesses such that the plurality of the third semiconductor layers 204C of the first fin structures 205A, the plurality of the first semiconductor layers 204A of the second fin structures 205B, and the plurality of the fifth semiconductor layers 204E of the third fin structures 205C are exposed. That is, the plurality of the third semiconductor layers 204C of the first fin structures 205A, the plurality of the first semiconductor layers 204A of the second fin structures 205B, and the plurality of the fifth semiconductor layers 204E of the third fin structures 205C are partially separated by the inner spacers. Then, n-type semiconductor materials, such as phosphorous-doped silicon (SiP), carbon-doped silicon (SiC), arsenic-doped silicon (SiAs), silicon (Si), or a combination thereof or p-type semiconductor materials, such as silicon germanium (SiGe), carbon-doped silicon germanium (SiGeC), germanium (Ge), or a combination thereof, may be epitaxially formed in the source/drain regions on the substrate 202, the plurality of first semiconductor layers 204A, the plurality of third semiconductor layers 204C, and the plurality of fifth semiconductor layers 204E to form the source/drain features 222. Although not separately shown, the source/drain features 222 may include n-type source/drain features formed from the aforementioned n-type semiconductor materials and the p-type source source/drain features formed from the aforementioned p-type semiconductor materials. The n-type source/drain features and p-type source/drain features may be formed sequentially and separately using photolithography techniques and more than one mask. For example, the n-type source/drain features may be formed first while the p-type source/drain regions are covered by a photolithographically patterned hard mask and then the p-type source/drain features may be formed while the n-type source/drain regions are covered by another photolithographically patterned hard mask. In some other examples, the p-type source/drain features may be formed first.

Referring to FIG. 1, the method 100 includes a block 114 where a dielectric layer (not shown) is formed over the substrate 202. The dielectric layer may be referred to as an interlayer dielectric (ILD) layer. In some embodiments, the dielectric layer may include silicon oxide, tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), other suitable dielectric materials, or combinations thereof. In some implementations, the dielectric layer may be formed over the workpiece 200 using CVD, flowable CVD (FCVD), or spin-on-glass. In some instances, block 114 may further include a planarization process to planarize a top surface of the dielectric layer before further processes.

Referring to FIGS. 1, 7A and 7B, the method 100 includes a block 116 where first channel members 214-1 in the first channel region (or third channel members 214-3 in the third channel region) and second channel members 214-2 in the second channel region are released. In some embodiments, at block 116, the dummy gate structures 207 (including the first dummy gate structure 207 and the second dummy gate structure 207') in the channel regions of the first fin structure 205A, the second fin structure 205B or the third fin structure 205C are removed to expose the channel regions of the first fin structures 205A, the second fin structures 205B and the third fin structures 205C. Then the exposed channel regions of the first fin structures 205A, the second fin structures 205B and the third fin structures 205C are subject to a selective etching process to selectively remove the plurality of second semiconductor layers 204B, the plurality of fourth semiconductor layers 204D, and the plurality of sixth semiconductor layers 204F. After the plurality of second semiconductor layers 204B, the plurality of fourth semiconductor layers 204D, and the plurality of sixth semiconductor layers 204F are removed, the first semiconductor layers 204A in the first fin structures 205A, the third semiconductor layers 204C in the second fin structures 205B, and the fifth semiconductor layers 204E in the third fin structures 205C in the channel regions are released to become first channel members 214-1, second channel members 214-2, and the third channel members 214-3. In some implementations, the plurality of second semiconductor layers 204B, the plurality of fourth semiconductor layers 204D, and the plurality of sixth semiconductor layers 204F are formed of silicon germanium. In those implementations, the plurality of second semiconductor layers 204B, the plurality of fourth semiconductor layers 204D, and the plurality of sixth semiconductor layers 204F may be first oxidized by an oxidizer, such as ozone, and then removed by a selective etch process that is selective to silicon germanium oxide.

Referring to FIGS. 1, 7A and 7B, the method 100 includes a block 118 where a first gate dielectric layer 216-1 and a second gate dielectric layer 216-2 are formed over the first channel members 214-1 and the second channel members 214-2, respectively. In some alternative embodiments in FIG. 7B, a third gate dielectric layer 216-3 is formed over the third channel members 214-3. In some embodiments, the semiconductor devices in the second region 20 are for high voltage applications, such as I/O application, and require thicker gate dielectric layers. In those embodiments, a first thickness G1 of the first gate dielectric layer 216-1 is smaller than either a second thickness G2 of the second gate dielectric layer 216-2 or a third thickness G3 of the third gate dielectric layer 216-3. In some implementations, a ratio of G2 to G1 (i.e. G2/G1) is between about 1.3 and about 3.0. Similarly, a ratio of G3 to G1 (i.e. G3/G1) is also between about 1.3 and about 3.0. G3 may or may not be identical to G1. In some instances, G3 is greater than G1. A first channel member thickness T1 corresponds to but is not identical to the first thickness L1, a second channel member thickness T2 corresponds to but is not identical to the second thickness L2, and a third channel member thickness T3 corresponds to but is not identical to the third thickness L3. In some implementations, a ratio of T2 to T1 (i.e. T2/T1) is between about 0.9 and about 1.3. In some instances, T2 may be between about 5 nm and about 10 nm and T1 may be between about 4 nm and about 8 nm. Similarly, a ratio of T3 to T1 (i.e. T3/T1) is between about 0.3 and about 1.3. In some embodiments, T1, T2, and T3 may substantially the same. In some embodiments, the first channel members 214-1 include a first pitch P1, the second channel members 214-2 includes a second pitch P2 different from the first pitch P1, and the third channel members 214-3 includes a third pitch P3 different from the first pitch P1. In some instances, both P2 and P3 are greater than P1. In some examples, a ratio of P2 to P1 (i.e. P2/P1) is between about 1.05 and about 1.3.Similarly, a ratio of P3 to p1 (i.e. P3/P1) is also between about 1.05 and about 1.3. P2 may or may not be identical to P3. In some instances, P1 may be between about 10 nm and about 20 nm; and P2 or P3 may be between about 12 nm and about 25 nm. In some embodiments, the first channel members 214-1 include a first spacing S1, the second channel members 214-2 includes a second spacing S2 different from the first spacing S1, and the third channel members 214-3 includes a third spacing S3 different from the first spacing S1. In some instances, both S2 and S3 are greater than S1. In some examples, a ratio of S2 to S1 (i.e. S2/S1) is between about 1.05 and about 1.4. Similarly, a ratio of S3 to S1 (i.e. S3/S1) is also between about 1.05 and about 1.4. In some implementations, S1 is between about 5 nm and about 12 nm and S2/S3 is between about 7 nm and about 15 nm.

The larger spacings (the second spacing S2 and the third spacing S3) and the larger pitches (the second pitch P2 and the third pitch P3) provide additional member-to-member vertical separation for the thicker second gate dielectric layer 216-2 and third gate dielectric layer 216-3 while still providing satisfactory process windows to form work function metal layers and gate fill materials. In conventional semiconductor devices or methods, channel members in different device regions have identical spacings and pitches. When a thicker gate dielectric layer is formed to meet demands of high voltage applications, those conventional devices and methods provide less member-to-member separation for work function metal layers and gate fill materials, resulting in reduced process windows. The number of the first channel members 214-1 corresponds to the first number N1 of the first semiconductor layers 204A. The number of the second channel members correspond to the second number N2 of the third semiconductor layers 204C. The number of the third channel members 214-3 corresponds to the third number N3 of the fifth semiconductor layers 204E. As described above, in some embodiments, N1 may be identical to N2 and N3 may be smaller than N1 by 1 (N1−1) or 2 (N1−2).

In some embodiments, the first gate dielectric layer 216-1, the second gate dielectric layer 216-2, and the third gate dielectric layer 216-3 may include a silicon oxide layer and a high-k dielectric layer. In some of those embodiments, the silicon oxide layer is doped with nitrogen. In some implementations, the high-k dielectric layer may include one or more metal oxides, such as $ZrO$, $Y_2O_3$, $La_2O_5$, $Gd_2O_5$, $TiO_2$, $Ta_2O_5$, HfErO, HfLaO, HfYO, HfGdO, HfAlO, HfZrO, HfTiO, HfTaO, SrTiO, or combinations thereof. The high-k dielectric layer has a dielectric constant greater than 9, including greater than 13. In some embodiments, the first gate dielectric layer 216-1 includes a silicon oxide layer of a thickness OT1 and a high-k dielectric layer of a thickness KT1; the second gate dielectric layer 216-2 includes a silicon oxide layer of a thickness OT2 and a high-k dielectric layer of a thickness KT2; and the third gate dielectric layer 216-3 includes a silicon oxide layer of a thickness OT3 and a high-k dielectric layer of a thickness KT3. In some instances, a ratio of KT2 to OT2 is less than 1 and a ratio of KT3 to OT3 is less than 1. In some embodiments, a ratio of KT1 to OT1 is larger than 1. In some examples, a ratio of OT2 to OT1 is larger than 2 and a ratio of OT3 to OT1 is also larger than 2.

Each of the first channel members 214-1 has a first width W1 along the Y direction, each of the second channel members 214-2 has a second width W2 along the Y direction, and each of the third channel members 214-3 gas a third width W3 along the Y direction. In some embodiments, a ratio of W2 to W1 (W2/W1) is between about 1.5 and about 10, including between about 1.5 and about 4 and a ratio of W3 to W1 (W3/W1) is between about 1.5 and about 10, including about 1.5 and about 4. In these embodiments, the GAA devices in the first region 10 may be referred to as nanowire GAA devices while the GAA devices in the second region 20 may be referred to as nanosheet GAA devices. In some instances, W1 is smaller than 15 nm and both W2 and W3 are greater than 15 nm. In some other instances, W1 is smaller than 20 nm and both W2 and W3 are greater than 20 nm.

Referring to FIGS. 1, 7A and 7B, the method 100 includes a block 120 where first metal gate structures 208 are formed over the first channel regions in the first region 10 and second metal gate structure 208' are formed over the second channel regions in the second region 20. As will be illustrated in FIGS. 8A and 8B, in those embodiments where the second region 20 is an I/O region, the second metal gate structures 208' in the second region 20 may be long metal gate structures that have a second gate length GL2 that is between about 1.5 times and about 4 times of a first gate length GL1 of the first metal gate structures 208 in the first region 10. For the ease of reference, the first metal gate structures 208 and the second metal gate structures 208' may be collectively referred to as metal gate structures 208. The metal gate structures 208 may include one or more work function metal layers and metal gate fill layers. As illustrated in FIGS. 7A and 7B, the metal gate structures 208 wrap around each of the channel members (the first channel members 214-1, the second channel members 214-2, and the third channel members 214-3) and the gate dielectric layers (the first gate dielectric layer 216-1, the second gate dielectric layer 216-2, and the third gate dielectric layer 216-3) are disposed between the metal gate structures 208 and the channel members. In some embodiments, after the one or more work function layer and the metal gate fill layers are deposited, a planarization process, such chemical mechanical polishing (CMP), may be performed to provide a planar top surface.

Referring to FIGS. 1, 8A and 8B, the method 100 includes a block 122 where further processes are performed. Such further processes may include formation of a gate-top hard mask 212 over the metal gate structure 208 (including the first metal gate structure 208 and the second metal gate structure 208'), formation of a silicide layer 224, formation of source/drain contacts 226, and formation of another ILD layer 228. In some embodiments, the source/drain contacts 226 may include one or more metal layers selected from a group that includes titanium (Ti), titanium nitride (TiN), nickel (Ni), molybdenum (Mo), platinum (Pt), cobalt (Co), ruthenium (Ru), tungsten (W), tantalum nitride (TaN), copper (Cu), or a combination thereof. FIG. 8A illustrate a first-type GAA transistor 1000 in the first region 10 and a second-type GAA transistor 2000 in the second region 20. Similarly, FIG. 8B illustrate a first-type GAA transistor 1000 in the first region 10 and an alternative second-type GAA transistor 2000' in the second region.

Based on the above discussions, the present disclosure offers advantages over conventional semiconductor devices that implement a uniform channel member pitch in GAA devices for different application. It is understood, however, that other embodiments may offer additional advantages, and not all advantages are necessarily disclosed herein, and that no particular advantage is required for all embodiments. The present disclosure puts forth a semiconductor device that includes a first-type GAA transistor to serve I/O functions and a second-type GAA transistor to serve core functions. To ensure process windows and performance, the channel members in the first-type GAA transistor have a first pitch that is greater than a second pitch of the channel members in the second-type GAA transistor. The first-type GAA transistor and the second-type GAA transistor are fabricated off of different epitaxial semiconductor stacks to achieve different pitches. In addition, to meet operating voltage requirements for its I/O functions, the first-type GAA transistor includes a first gate dielectric layer that is thicker than a second gate dielectric layer of the second-type GAA transistor.

The disclosure of the present disclosure provides embodiments of semiconductor devices and methods of forming the same. In one embodiment, a semiconductor device is provided. The semiconductor device includes a first gate-all-around (GAA) transistor including a first plurality of channel members, and a second GAA transistor including a second plurality of channel members. The first plurality of channel members has a first pitch (P1) and the second plurality of channel members has a second pitch (P2) smaller than the first pitch (P1).

In some embodiments, the first GAA transistor further includes a first gate dielectric layer over the first plurality of channel members, the second GAA transistor further includes a second gate dielectric layer over the second plurality of channel members, and the first gate dielectric layer comprises a first thickness (G1) and the second gate dielectric layer comprises a second thickness (G2) smaller than the first thickness (G1). In some implementations, a ratio of the first thickness to the second thickness (G1/G2) is between about 1.3 and about 3.0. In some implementations, a ratio of the first pitch to the second pitch (P1/P2) is between about 1.05 and about 1.3. In some instances, the first plurality of channel members includes a first spacing (S1) between two neighboring channel members of the first plurality of channel members, the second plurality of channel members includes a second spacing (S2) between two neighboring channel members of the second plurality of channel members, and the first spacing (S1) is greater than the second spacing (S2). In some embodiments, a ratio of the first spacing to the second spacing (S1/S2) is between about 1.05 and about 1.4. In some implementations, each of the first plurality of channel members includes a first channel thickness (T1), each of the second plurality of channel members includes a second channel thickness (T2), and a ratio of the first channel thickness to the second channel thickness (T1/T2) is between about 0.9 and about 1.3. In some embodiments, each of the first plurality of channel members includes a first number (N1) of channel members, each of the second plurality of channel members includes a second number (N2) of channel members, and the first number (N1) is identical to the second number (N2). In some instances, each of the first plurality of channel members includes a first number (N1) of channel members, each of the second plurality of channel members includes a second number (N2) of channel members, and the first number (N1) is smaller than the second number (N2).

In another embodiment, a semiconductor device is provided. The semiconductor device includes an input/output (I/O) region including a first gate-all-around (GAA) transistor that includes a first plurality of channel members, and a core region including a second GAA transistor that includes a second plurality of channel members. The first plurality of channel members has a first pitch (P1) and the second plurality of channel members has a second pitch (P2) smaller than the first pitch (P1).

In some embodiments, a ratio of the first pitch to the second pitch (P1/P2) is between about 1.05 and about 1.3. In some embodiments, the first GAA transistor further includes a first gate dielectric layer over the first plurality of channel members, the second GAA transistor further includes a second gate dielectric layer over the second plurality of channel members, and the first gate dielectric layer includes a first thickness (G1) and the second gate dielectric layer comprises a second thickness (G2) smaller than the first thickness (G1). In some implementations, each of the first plurality of channel members includes a first gate length (GL1), each of the second plurality of channel members includes a second gate length (GL2), and a ratio of the first gate length to the second gate length (GL1/GL2) is greater than 2. In some implementations, each of the first plurality of channel members includes a first number (N1) of channel members, each of the second plurality of channel members includes a second number (N2) of channel members, and the first number (N1) is smaller than the second number (N2).

In a further embodiment, a method is provided. The method includes forming a first plurality of alternating semiconductor layers over a first region and a second region of a substrate, where the first plurality of alternating semiconductor layers includes a first plurality of first semiconductor layers interleaved by a second plurality of second semiconductor layers. The method further includes removing the first plurality of alternating semiconductor layers over the first region of the substrate, and forming a second plurality of alternating semiconductor layers over the first region of the substrate, where the second plurality of alternating semiconductor layers includes a third plurality of first semiconductor layers interleaved by a fourth plurality of second semiconductor layers.

In some embodiments, the first plurality of first semiconductor layers includes a first layer pitch, and the third plurality of first semiconductor layers includes a second layer pitch smaller than the first layer pitch. In some implementations, each of the second plurality of second semiconductor layers includes a first layer thickness and each of the fourth plurality of fourth semiconductor layers includes a second layer thickness smaller than the first layer thickness. In some instances, the first plurality of first semiconductor layers includes a first number of first semiconductor layers, the second plurality of second semiconductor layers includes a second number of second semiconductor layers, and the first number is smaller than the second number. In some embodiments, the method further includes patterning the second plurality of alternating semiconductor layers over the first region to form a first active region, patterning the first plurality of alternating semiconductor layers over the second region to form a second active region, forming a first plurality of channel members out of the first plurality of first semiconductor layers in a first channel region of the first active region, and forming a second plurality of channel members out of the third plurality of first semiconductor layers in a second channel region of the second active region. In some instances, the method may further include forming a first gate dielectric layer to a first thickness over the first plurality of channel members and forming a second gate dielectric layer to a second thickness over the second plurality of channel members. The first thickness is greater than the second thickness.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit-line conductor and word line conductor, one can achieve different resistances for the conductors. However, other techniques to vary the resistances of the metal conductors may also be utilized as well.

What is claimed is:

1. A semiconductor device, comprising:
a substrate comprising a first p-type well and a second p-type well;
a first shallow trench isolation (STI) feature extending into the substrate, a portion of the first STI feature being disposed over the first p-type well;
a second STI feature extending into the substrate, a portion of the second STI feature being disposed over the second p-type well;
a first gate-all-around (GAA) transistor disposed directly over the first p-type well, the first GAA transistor comprising a first plurality of channel members extending along a first direction and a first gate structure wrapping around each of the first plurality of channel members, the first gate structure comprising a first gate dielectric layer over the first plurality of channel members and a first gate electrode extending along a second direction perpendicular to the first direction;
a second GAA transistor disposed directly over the second p-type well, the second GAA transistor comprising a second plurality of channel members extending along the first direction and a second gate structure wrapping around each of the second plurality of channel members, the second gate structure comprising a second gate dielectric layer over the second plurality of channel members and a second gate electrode extending along the second direction; and
a hard mask layer disposed on the first gate structure and the second gate structure,
wherein the first plurality of channel members has a first pitch (P1) and the second plurality of channel members has a second pitch (P2) smaller than the first pitch (P1),
wherein the first gate structure is disposed between two first gate end dielectric features along the second direction,
wherein the two first gate end dielectric features are disposed directly on the first STI feature,
wherein the second gate structure is disposed between two second gate end dielectric features along the second direction,
wherein the two second gate end dielectric features are disposed directly on the second STI features,
wherein the first gate structure is in physical contact with the first p-type-well and the second gate structure is in physical contact with the second p-type well,
wherein the hard mask layer is disposed on top surfaces of the two first gate end dielectric features, the two second gate end dielectric features, the first gate structure, and the second gate structure.

2. The semiconductor device of claim 1,
wherein the first gate dielectric layer comprises a first thickness (G1) and the second gate dielectric layer comprises a second thickness (G2) smaller than the first thickness (G1).

3. The semiconductor device of claim 2, wherein a ratio of the first thickness to the second thickness (G1/G2) is between about 1.3 and about 3.0.

4. The semiconductor device of claim 1, wherein a ratio of the first pitch to the second pitch (P1/P2) is between about 1.05 and about 1.3.

5. The semiconductor device of claim 1,
wherein the first plurality of channel members includes a first spacing (S1) between two neighboring channel members of the first plurality of channel members,
wherein the second plurality of channel members includes a second spacing (S2) between two neighboring channel members of the second plurality of channel members,
wherein the first spacing (S1) is greater than the second spacing (S2).

6. The semiconductor device of claim 5, wherein a ratio of the first spacing to the second spacing (S1/S2) is between about 1.05 and about 1.4.

7. The semiconductor device of claim 1,
wherein each of the first plurality of channel members comprises a first channel thickness (T1),
wherein each of the second plurality of channel members comprises a second channel thickness (T2),
wherein a ratio of the first channel thickness to the second channel thickness (T1/T2) is between about 0.9 and about 1.3.

8. The semiconductor device of claim 1,
wherein each of the first plurality of channel members comprises a first number (N1) of channel members,
wherein each of the second plurality of channel members comprises a second number (N2) of channel members,
wherein the first number (N1) is smaller than the second number (N2).

9. The semiconductor device of claim 1, further comprising:
a third GAA transistor comprising a third plurality of channel members extending the first direction; and
a fourth GAA transistor comprising a fourth plurality of channel members extending along the first direction,
wherein the substrate further comprises a first n-type well adjacent the first p-type well and a second n-type well adjacent the second p-type well,
wherein the third GAA transistor is disposed over the first n-type well and the fourth GAA transistor is disposed over the second n-type well,
wherein the first gate electrode wraps around each of the third plurality of channel members, wherein the second gate electrode wraps around each of the fourth plurality of channel members.

10. A semiconductor device, comprising:
an input/output (I/O) region comprising a first gate-all-around (GAA) transistor that includes:
  a first plurality of channel members disposed over a first doped well and extending from a first source/drain feature to a second source/drain feature along a direction,
  a first gate structure wrapping around each of the first plurality of channel members, and
  a dielectric gate structure; and
a core region comprising a second GAA transistor that includes:
  a second plurality of channel members disposed over a second doped well, and
  a second gate structure wrapping around each of the second plurality of channel members,
wherein the first plurality of channel members has a first pitch (P1) and the second plurality of channel members has a second pitch (P2) smaller than the first pitch (P1),
wherein the first source/drain feature is disposed between the first gate structure and the dielectric gate structure along the direction,
wherein the first gate structure is in physical contact with the first doped well and the second gate structure is in physical contact with the second doped well.

11. The semiconductor device of claim 10, wherein a ratio of the first pitch to the second pitch (P1/P2) is between about 1.05 and about 1.3.

12. The semiconductor device of claim 10,
wherein the first GAA transistor further includes a first gate dielectric layer over the first plurality of channel members,
wherein the second GAA transistor further includes a second gate dielectric layer over the second plurality of channel members,
wherein the first gate dielectric layer comprises a first thickness (G1) and the second gate dielectric layer comprises a second thickness (G2) smaller than the first thickness (G1).

13. The semiconductor device of claim 10,
wherein each of the first plurality of channel members comprises a first gate length (GL1),
wherein each of the second plurality of channel members comprises a second gate length (GL2),
wherein a ratio of the first gate length to the second gate length (GL1/GL2) is greater than 2.

14. The semiconductor device of claim 10,
wherein each of the first plurality of channel members comprises a first number (N1) of channel members,
wherein each of the second plurality of channel members comprises a second number (N2) of channel members,
wherein the first number (N1) is smaller than the second number (N2).

15. A semiconductor structure, comprising:
a substrate including a first n-type well and a second n-type well;
first channel members directly over the first n-type well, the first channel members being vertically stacked one over another and extending along a first direction;
a first gate structure wrapping around each of the first channel members and extending along a second direction perpendicular to the first direction;
second channel members directly over the second n-type well, the second channel members being vertically stacked one over another and extending along the first direction; and
a second gate structure wrapping around each of the second channel members and extending along the second direction,
wherein a number of the first channel members is smaller than a number of the second channel members,
wherein the first gate structure is disposed between two first gate end dielectric features along the second direction,
wherein the second gate structure is disposed between two second gate end dielectric features along the second direction,
wherein the first gate structure is in physical contact with the first n-type well and the second gate structure is in physical contact with the second n-type well.

16. The semiconductor structure of claim 15, wherein the first channel members comprise a first pitch (P1) and the second channel members comprise a second pitch (P2) smaller than the first pitch (P1).

17. The semiconductor structure of claim 16, wherein a ratio of the first pitch to the second pitch (P1/P2) is between about 1.05 and about 1.3.

18. The semiconductor structure of claim 15,
wherein the first gate structure comprises a first gate dielectric layer,
wherein the second gate structure comprises a second gate dielectric layer,
wherein the first gate dielectric layer comprises a first thickness (G1) and the second gate dielectric layer comprises a second thickness (G2) smaller than the first thickness (G1).

19. The semiconductor structure of claim 15,
wherein the first channel members comprise a first gate length (GL1), and
wherein the second channel members comprise a second gate length (GL2) smaller than the first gate length (GL1).

20. The semiconductor structure of claim 19,
wherein a ratio of the first gate length to the second gate length (GL1/GL2) is greater than 2.

* * * * *